(12) United States Patent
Yang (10) Patent No.: US 12,127,461 B2
(45) Date of Patent: Oct. 22, 2024

(54) DISPLAY PANEL AND DISPLAY DEVICE

(71) Applicant: Wuhan China Star Optoelectronics Semiconductor Display Technology Co., Ltd., Hubei (CN)

(72) Inventor: Cheng Yang, Hubei (CN)

(73) Assignee: Wuhan China Star Optoelectronics Semiconductor Display Technology Co., Ltd., Wuhan (CN)

(*) Notice: Subject to any disclaimer, the term of this patent is extended or adjusted under 35 U.S.C. 154(b) by 0 days.

(21) Appl. No.: 17/623,283

(22) PCT Filed: Dec. 23, 2021

(86) PCT No.: PCT/CN2021/140748
§ 371 (c)(1),
(2) Date: Dec. 28, 2021

(87) PCT Pub. No.: WO2023/108783
PCT Pub. Date: Jun. 22, 2023

(65) Prior Publication Data
US 2024/0040885 A1 Feb. 1, 2024

(30) Foreign Application Priority Data
Dec. 16, 2021 (CN) .......................... 202111545681.6

(51) Int. Cl.
*H01L 27/14* (2006.01)
*H10K 59/35* (2023.01)
(Continued)

(52) U.S. Cl.
CPC ........... *H10K 59/38* (2023.02); *H10K 59/353* (2023.02); *H10K 59/65* (2023.02)

(58) Field of Classification Search
CPC ...... H10K 59/38; H10K 59/353; H10K 59/65; H10K 59/8792; H10K 59/124; H10K 59/80521
(Continued)

(56) References Cited

U.S. PATENT DOCUMENTS

2015/0236076 A1 8/2015 Sim
2023/0026941 A1 1/2023 Lv et al.

FOREIGN PATENT DOCUMENTS

| CN | 108922900 | 11/2018 |
| CN | 109950288 | 6/2019 |

(Continued)

OTHER PUBLICATIONS

Notification of Office Action and Search Report Dated Jul. 26, 2024 From The State Intellectual Property Office Re. Application No. 202111545681.6 and Its Translation Into English. (20 Pages).

*Primary Examiner* — Tan N Tran (57) ABSTRACT

A display panel and a display device are provided. The display panel includes a first display area and a second display area, the first display area is provided with a plurality of first pixel repeating units disposed in array, and the second display area is provided with a plurality of second pixel repeating units disposed in array, wherein a quantity of the first light-emitting units included in the first pixel repeating unit is equal to a quantity of the second light-emitting units included in the second pixel repeating unit, and an area of the first pixel repeating unit is smaller than an area of the second pixel repeating unit.

16 Claims, 9 Drawing Sheets

(51) Int. Cl.
*H10K 59/38* (2023.01)
*H10K 59/65* (2023.01)

(58) Field of Classification Search
USPC .................................................. 257/59, 72
See application file for complete search history.

(56) References Cited

FOREIGN PATENT DOCUMENTS

| | | | |
|---|---|---|---|
| CN | 110767708 | | 2/2020 |
| CN | 111129102 | | 5/2020 |
| CN | 109950288 B | * | 5/2021 |
| CN | 113178537 | | 7/2021 |
| CN | 113629208 | | 11/2021 |
| CN | 113745271 | | 12/2021 |

* cited by examiner

DISPLAY PANEL AND DISPLAY DEVICE

RELATED APPLICATIONS

This application is a National Phase of PCT Patent Application No. PCT/CN2021/140748 having International filing date of Dec. 23, 2021, which claims the benefit of priority of Chinese Patent Application No. 202111545681.6 filed on Dec. 16, 2021. The contents of the above applications are all incorporated by reference as if fully set forth herein in their entirety.

FIELD AND BACKGROUND OF THE INVENTION

The present disclosure relates to the field of display technology, and in particular, to a display panel and a display device.

The organic light-emitting diode (called OLED for short) mainly has the advantages of self-emitting, capability of being designed for flexible screens, high light-emitting efficiency and fast response time. With the progress of screen production technology, the technology of camera under panel (called CUP for short) with display function has been gradually developed, in order to pursue higher screen ratio and higher integration of electronic components in OLED screen design.

The OLED display panel applied with CUP technology generally comprises a CUP area and a normal display area, and ambient light can transmit into the camera through a gap area between the sub-pixels in the CUP area, so as to realize imaging. However, the low light transmittance of current CUP area is still unable to meet the demand of imaging of high quality of the camera. One of the ways to improve light transmittance is to design the structure of layers in the gap area between sub-pixels in the CUP area. Nonetheless, the gap area between sub-pixels in the CUP area has a small area at present, so it is difficult to design the structure of layers in the gap area, which needs to be solved urgently.

SUMMARY OF THE INVENTION

The present disclosure is provided with a display panel and a display device, which can solve the problem of difficulty to design the structure of layers in the gap area caused by the gap area between sub-pixels in the CUP area with a small area.

In one aspect, an embodiment of the present disclosure is provided with a display panel including a first display area and a second display area surrounding the first display area, wherein the display panel further includes a substrate and a light-emitting layer disposed at a side of the substrate, wherein the light-emitting layer includes a plurality of first pixel repeating units disposed in the first display area and a plurality of second pixel repeating units disposed in the second display area, each of the first pixel repeating units includes a plurality of first light-emitting units, and each of the second pixel repeating units includes a plurality of second light-emitting units, and wherein a quantity of the first light-emitting units included in one of the first pixel repeating units is equal to a quantity of the second light-emitting units included in one of the second pixel repeating units, and an area of one of the first pixel repeating units is smaller than an area of one of the second pixel repeating units.

Alternatively, the display panel further includes a first electrode layer disposed between the substrate and the light-emitting layer, and a second electrode layer disposed at a side of the light-emitting layer away from the substrate, wherein the second electrode layer includes a plurality of first light-transmitting holes defined in the first display area, and the first light-transmitting holes are located between the adjacent first pixel repeating units.

Alternatively, the display panel further includes a driving circuit layer disposed between the substrate and the light-emitting layer, wherein the driving circuit layer includes a plurality of second light-transmitting holes defined in the first display area, and the second light-transmitting holes correspond to the first light-transmitting holes.

Alternatively, the second electrode layer covers at least a part of side walls of the second light-transmitting holes.

Alternatively, the light-emitting layer includes a plurality of third light-transmitting holes defined in the first display area, and each of the first light-transmitting holes communicates with corresponding one of the second light-transmitting holes by corresponding one of the third light-transmitting holes.

Alternatively, the display panel further includes a color filter layer disposed at a side of the second electrode layer away from the substrate, wherein the color filter layer includes a light shielding layer and color resist, the light shielding layer defines a plurality of first openings corresponding to the first light-emitting units, a plurality of second openings corresponding to the second light-emitting units, and a plurality of fourth light-transmitting holes in the first display area, the color resist is filled in the first openings and the second openings, and the fourth light-transmitting holes correspond to the first light-transmitting holes.

Alternatively, a distribution density of the first pixel repeating units in the first display area is equal to a distribution density of the second pixel repeating units in a region with a same shape and area as the first display area in the second display area.

Alternatively, a distribution density of the first pixel repeating units in the first display area is equal to a distribution density of the second pixel repeating units in a region with a same shape and area as the first display area in the second display area.

Alternatively, a distribution density of the first light-emitting units is different from a distribution density of the second light-emitting units in a unit size.

Alternatively, an arrangement of the first light-emitting units in the first pixel repeating unit is to the same as an arrangement of the second light-emitting units in the second pixel repeating unit.

Alternatively, a distance between adjacent two of the first light-emitting units in the first pixel repeating unit is less than a distance between corresponding adjacent two of the second light-emitting units in the second pixel repeating unit.

Alternatively, the first light-emitting units in each first pixel repeating unit include first sub-pixels displaying a first color, second sub-pixels displaying a second color, and third sub-pixels displaying a third color, and the second light-emitting units in each second pixel repeating unit include fourth sub-pixels displaying the first color, fifth sub-pixels displaying the second color, and sixth sub-pixels displaying the third color, and wherein a distance between two adjacent first sub-pixels in each of the first pixel repeating units is smaller than a distance between two adjacent fourth sub-pixels in each of the second pixel repeating units, a distance between two adjacent second sub-pixels in each of the first pixel repeating units is smaller than a distance between two adjacent fifth sub-pixels in each of the second pixel repeating units, and a distance between two adjacent third sub-pixels in each of the first pixel repeating units is smaller than a distance between two adjacent sixth sub-pixels in each of the second pixel repeating units.

Alternatively, a size of the first light-emitting unit is smaller than a size of the second light-emitting unit in the first light-emitting units and the second light-emitting units with a same light-emitting color.

Alternatively, the display panel further includes a transition display area disposed between the first display area and the second display area, and a plurality of pixel driving circuits electrically connected to the first light-emitting units are disposed in the transition display area.

Alternatively, a plurality of pixel driving circuits electrically connected with the first light-emitting units are disposed in the first display area, and the pixel driving circuits are overlapped with the first pixel repeating units.

Alternatively, in each of the first pixel repeating units, a plurality of the first light-emitting units with a same light-emitting color are electrically connected to a same pixel driving circuit.

Alternatively, the first light-emitting units in each of the first pixel repeating units include two first sub-pixels displaying a first color, two second sub-pixels displaying a second color, and four third sub-pixels displaying a third color, wherein a size of the first sub-pixel and a size of the second sub-pixel both are greater than a size of the third sub-pixel.

Alternatively, each of the first light-emitting units is electrically connected to a corresponding one of the pixel driving circuits.

In the other aspect, an embodiment of the present disclosure is provided with a display device including an optical element, and any one of the above display panels, wherein the optical element is located at a side of the display panel and corresponds to the first display area of the display panel.

In the embodiments of the present disclosure, the first light-emitting units of a fixed quantity in the first display area are grouped as a first pixel repeating unit, the second light-emitting units of a corresponding quantity in the second display area are grouped as a second pixel repeating unit, and an area of the first pixel repeating unit is smaller than an area of the second pixel repeating unit, thus realizing a gap area between adjacent first pixel repeating units of a larger area than that of a gap area between adjacent second pixel repeating units, so as to facilitate the design of the structure of layers in the gap area between adjacent first pixel repeating units and to provide a light transmitting structure to improve the light transmittance of the first display area.

BRIEF DESCRIPTION OF THE SEVERAL VIEWS OF THE DRAWINGS

To describe the technical solutions of the embodiments of the present disclosure more clearly, the following briefly introduces the accompanying drawings used in the description of the embodiments of the present disclosure. Apparently, the accompanying drawings described below illustrate only some exemplary embodiments of the present disclosure, and persons skilled in the art may derive other drawings from the drawings without making creative efforts.

DESCRIPTION OF SPECIFIC EMBODIMENTS OF THE INVENTION

The technical solutions in the embodiments of the present disclosure will be described clearly and completely hereafter with reference to the accompanying drawings. Apparently, the described embodiments are only a part of but not all embodiments of the present disclosure. All other embodiments obtained by persons of ordinary skill in the art based on the embodiments of the present disclosure without creative efforts shall fall within the protection scope of the present disclosure. Moreover, it should be understood that the specific implementations described herein are merely used to describe and explain this disclosure rather than limit this disclosure. In the present disclosure, unless contrarily described, the used orientational terms, such as "up and down", are usually refers "up and down" when in the actual using or operating state of the device, specifically, being in the direction in the drawing. "Inside and outside" are relative to the profile of the device.

Various embodiments and examples are provided in the following description to implement different structures of the present disclosure. In order to simplify the present disclosure, certain elements and settings will be described. However, these elements and settings are only by way of example and are not intended to limit the present disclosure. In addition, reference numerals may be repeated in different examples in the present disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. It is described in detail in the following. It should be noted that the description sequence of the following embodiments does not limit the optimization sequence of the embodiments.

First Embodiment

Figure 1:
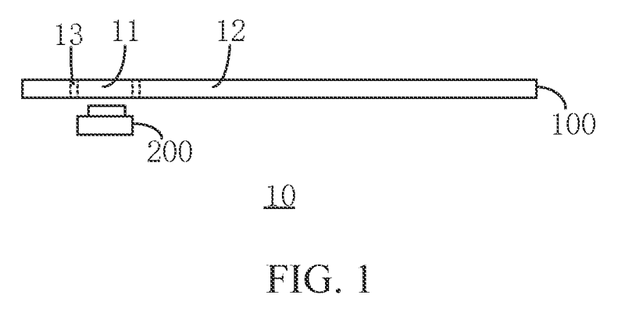
FIG. 1 is a structural schematic diagram illustrating a display device according to a first embodiment of the present disclosure.

FIG. 1 is a structural schematic diagram illustrating a display device according to a first embodiment of the present disclosure. As shown in FIG. 1, the embodiment of the present disclosure is provided with a display device 100. The display device includes an optical element 200 and a display panel 100, wherein the optical element 200 includes at least one of a camera, an ambient light sensor, a structural light module, and other photosensitive elements, and wherein the display panel 100 is an OLED display panel, a Mini LED display panel or a Micro LED display panel. Preferably, the optical element 200 includes a camera, and the display panel 100 is an OLED display panel.

In the embodiment, the optical element 200 is located at a side of the display panel 100. In detail, the display panel 100 includes a light-emitting side and a back side, and the optical element 200 is located at the back side of the display panel 100. Ambient light can pass through the display panel 100 and transmits into the optical element 200 located at the back side of the display panel 100.

Figure 2:
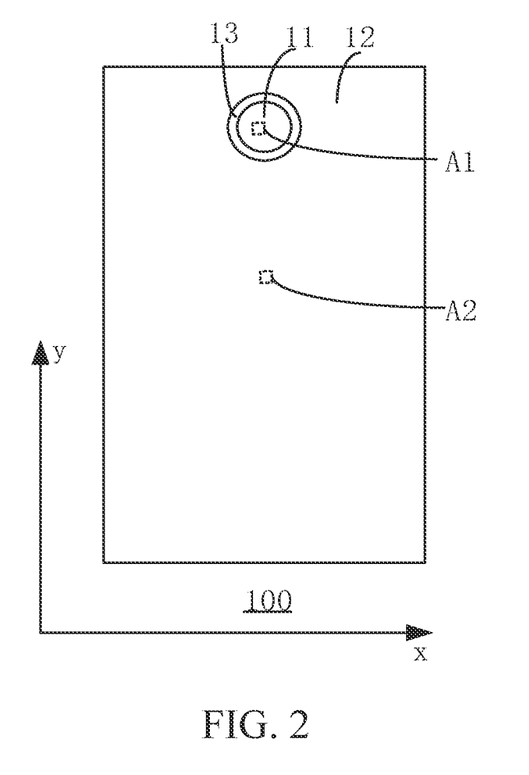
FIG. 2 is a top-down schematic diagram illustrating a display panel according to the first embodiment of the present disclosure.

FIG. 2 is a top-down schematic diagram illustrating the display panel according to the first embodiment of the present disclosure. As shown in the combination with FIGS. 1 and 2, in the embodiment, the display panel 100 includes a first display area 11, a second display area 12 and a transition display area 13 disposed between the first display area 11 and the second display area 12, wherein second display area around 12 is surrounding the first display area 11, and the optical element 200 located at the back side of the display panel 100 is corresponding to the first display area 11 of the display panel 100. In other words, the first display area 11 is a CUP area, and the second display area 12 is a normal display area. Accordingly, the first display area 11 and the second display area 12 are provided with light-emitting units (not shown) for display function. The difference is that the first display area 11 of the display panel 100 further has a light-transmitting function. When the light-transmitting function is performed in the first display area 11 of the display panel 100, the light-emitting units in the first display area 11 do not emit light. Ambient light can pass through the first display area 11 of the display panel 100 and transmits into the optical element 200 located at the back side of the display panel 100, and the camera of the optical element 200 obtains ambient light and performs imaging. Accordingly, in order to ensure the imaging quality of the camera, the light transmittance of the first display area 11 of the display panel 100 is greater than that of the second display area 12.

Figure 3:
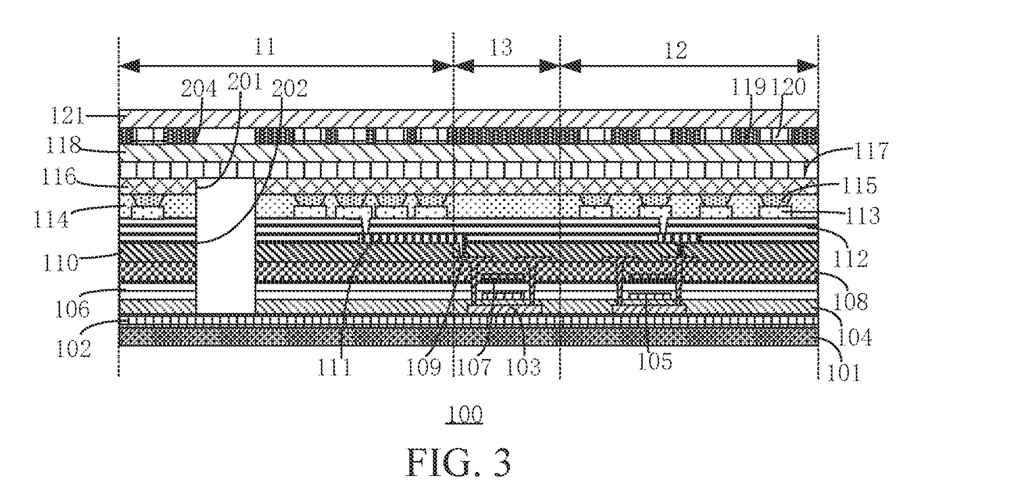
FIG. 3 is a first sectional schematic diagram illustrating the display panel according to the first embodiment of the present disclosure.
Figure 4:
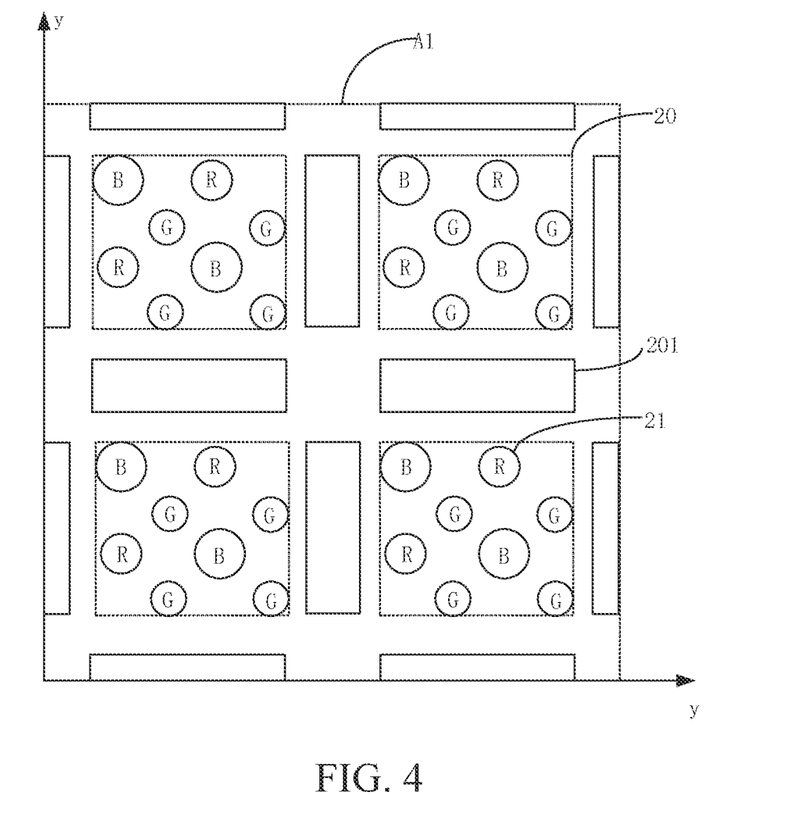
FIG. 4 is a first positional schematic diagram illustrating first pixel repeating units and first light-transmitting holes of the region A1 in FIG. 2.
Figure 5:
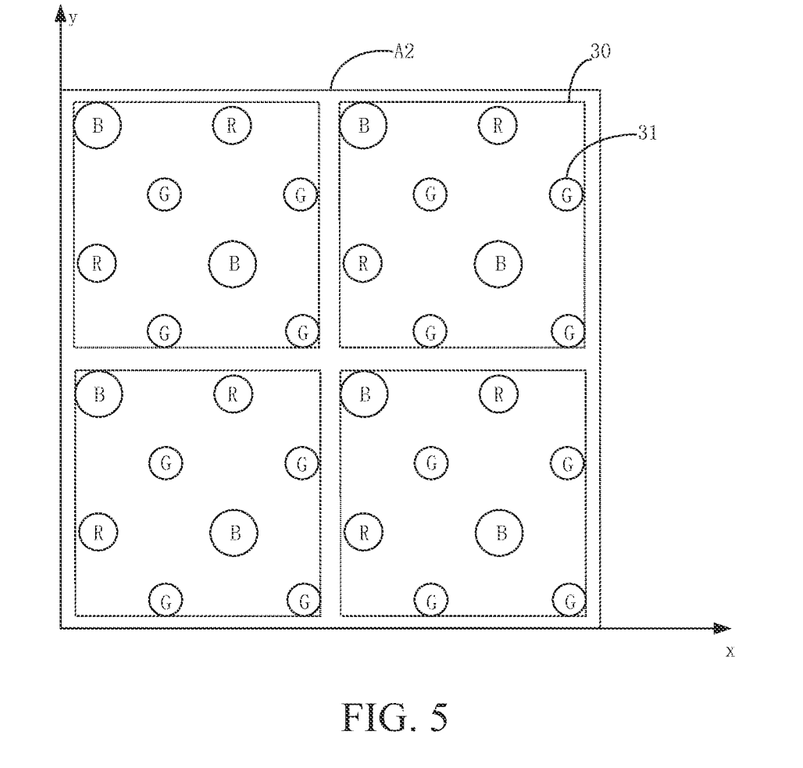
FIG. 5 is a positional schematic diagram illustrating second pixel repeating units of the region A2 in FIG. 2.

FIG. 3 is a first sectional schematic diagram illustrating the display panel according to the first embodiment of the present disclosure, FIG. 4 is a first positional schematic diagram illustrating first pixel repeating units and first light-transmitting holes of portion A1 in FIG. 2., and FIG. 5 is a positional schematic diagram illustrating second pixel repeating units of portion A2 in FIG. 2. As shown in the combination with FIGS. 3 to 5, in the embodiment, the display panel 100 includes a substrate 101 as a carrier of other layer structures in the display panel 100, which can be a rigid substrate or a flexible substrate. Materials thereof include at least one of glass, plastic, silicon dioxide, polyethylene, polypropylene, polystyrene, polylactic acid, polyethylene terephthalate, polyimide, and polyurethane.

In the embodiment, the display panel 100 further includes a light-emitting layer 115 disposed at a side of the substrate 101 and a plurality of light-emitting units for performing the display function. In detail, the light-emitting layer 115 includes a plurality of first pixel repeating units 20 disposed in the first display area 11 and a plurality of second pixel repeating units 30 disposed in the second display area 12. Wherein, each of the first pixel repeating units includes a plurality of light-emitting units, and the light-emitting units in the first pixel repeating units 20 are defined as first light-emitting units 21. Each of the second pixel repeating units 30 includes a plurality of light-emitting units, and the light-emitting units in the second pixel repeating units 30 are defined as second light-emitting units 31.

In the embodiment, the region A1 is a rectangular region, and the region A2 is a rectangular region with the same shape and area as the region A1. Wherein, a quantity of the first light-emitting units 21 included in one of the first pixel repeating units 20 is equal to a quantity of the second light-emitting units 31 included in one of the second pixel repeating units and an area of one of the first pixel repeating units 20 is smaller than an area of one of the second pixel repeating units 30. Since the first display area 11 has a light-transmitting function, in order to make the light transmittance of the first display area 11 greater than that of the second display area 12 and improve the light obtaining amount and imaging quality of the camera, the structure of layers in a gap area between the first light-emitting units 21 in the first display area 11 needs to be designed, to reduce the light loss of ambient light passing through the gap area between the first light-emitting units 21 and improve the light transmittance. In the embodiment of the present disclosure, the area of the first pixel repeating unit 20 is smaller than the area of the second pixel repeating unit 30, increasing the gap distance between the adjacent first pixel repeating units 20 and the area of the gap area between the adjacent first pixel repeating units creating conditions for the subsequent design of the structure of layers in the gap area between the adjacent first pixel repeating units 20, reducing the difficulty of the design of the layer structure, and effectively improving the light transmittance of the first display area 11. Moreover, because the quantity of the first light-emitting units 21 included in the first pixel repeating unit 20 is not decreased compared with the quantity of the second light-emitting units 31 included in the second pixel repeating unit 30, the overall display effect of each first pixel repeating unit 20 and the overall display effect of each second pixel repeating unit 30 are substantially same, reducing the display difference between the first display area 11 and the second display area 12.

In the embodiment, the direction x is the first direction, and the direction y is the second direction. The area of the first pixel repeating unit 20 refers the area of a rectangle, which is surrounding by two straight lines tangent to the outermost first light-emitting units 21 of the first pixel repeating unit 20 along the direction x and two straight lines tangent to the outermost first light-emitting units 21 of the first pixel repeating unit 20 along the direction y. The area of the second pixel repeating unit 30 refers the area of a rectangle, which is surrounding by two straight lines tangent to the outermost second light-emitting units 31 of the second pixel repeating unit 30 along the direction x and two straight lines tangent to the outermost first light-emitting units 21 of the first pixel repeating unit 20 along the direction y.

How to design the layer structure in the gap area between the adjacent first pixel repeating units 20 is specified as below, according to the present disclosure.

In the embodiment, the display panel 100 further includes a first electrode layer 113 and a second electrode layer 116, wherein the first electrode layer 113 is arranged between the substrate 101 and the light-emitting layer 115, the second electrode layer 116 is arranged at a side of the light-emitting layer 115 away from the substrate 101, and the first electrode layer 113 and the second electrode layer 116 are configured to be connected to the light-emitting layer 115, respectively.

In the embodiment, the first electrode layer 113 is, for example, an anode layer and includes a plurality of anode units arranged corresponding to the light-emitting units in a one-to-one manner.

In the embodiment, the second electrode layer 116 is, for example, a cathode layer. The second electrode layer 116 includes a plurality of first light-transmitting holes 201 defined in the first display area 11, and the first light-transmitting holes 201 are located between the adjacent first pixel repeating units 20. In the embodiment of the present disclosure, the second electrode layer 116 is patterned to define the first light-transmitting holes 201 corresponding to the gap area between the adjacent first pixel repeating unit 20 in the second electrode layer 116, thus reducing the filter effect of the second electrode layer 116 on ambient light passing through the gap area between the first light-emitting units 21 to reduce the light loss, effectively improving the light transmittance of the first display area 11, improving the light obtaining amount of the optical element 200, and improving the imaging effect of the camera.

In the embodiment, the display panel 100 further includes a driving circuit layer disposed between the substrate 101 and the light-emitting layer 115, wherein the driving circuit layer defines a plurality of second light-transmitting holes 202 in the first display area 11, and the second light-transmitting holes 202 correspond to the first light-transmitting holes 201. In the embodiment of the present disclosure, the second light-transmitting holes 202 corresponding to the first light-transmitting holes 201 are defined in the driving circuit layer, thus reducing the filter effect of the driving circuit layer on ambient light passing through the gap area between the first light-emitting units 21 to reduce the light loss, effectively improving the light transmittance of the first display area 11, improving the light obtaining amount of the optical element 200, and improving the imaging effect of the camera.

In the embodiment, the driving circuit layer includes a buffer layer 102, a thin film transistor layer, a planarization layer and a pixel defining layer 114 which are arranged on the substrate 101 in sequence, wherein the buffer layer 102 is such as a layer formed by inorganic materials, and pixel driving circuits consisting of thin film transistors and metal wires are formed in the thin film transistor layer. Types of the thin film transistor includes at least one of low temperature polysilicon type, metal oxide semiconductor type and amorphous silicon type. For example, the thin film transistor layer includes an active semiconductor layer 103, a first inorganic insulating layer 104, a first metal layer 105, a second inorganic insulating layer 106, a second metal layer 107, a third inorganic insulating layer 108, and a third metal layer 109 which are arranged on the buffer layer 102 in sequence. The planarization layer can be a single or composite organic layer. For example, the planarization layer includes a first planarization layer 110 and a second planarization layer 112. The pixel defining layer 114 includes pixel defining openings corresponding to the light-emitting units in a one-to-one manner, and the light-emitting units are disposed in the pixel defining openings.

In the embodiment, the second light-transmitting holes 202 can be defined in at least one of the thin film transistor layer, the planarization layer, and the pixel defining layer 114. When the second light-transmitting holes 202 are defined in the thin film transistor layer, the second light-transmitting holes 202 can be defined in at least one of sub-layers of the thin film transistor layer, and the sub-layers includes, for example, a first inorganic insulating layer 104, a second inorganic insulating layer 106, and a third inorganic insulating layer 108. When the second light-transmitting holes 202 are defined in the planarization layer, the second light-transmitting holes 202 can be defined in at least one of sub-layers of the planarization layer, and the sub-layers includes, for example, the first planarization layer 110 and the second planarization layer 112.

Figure 6:
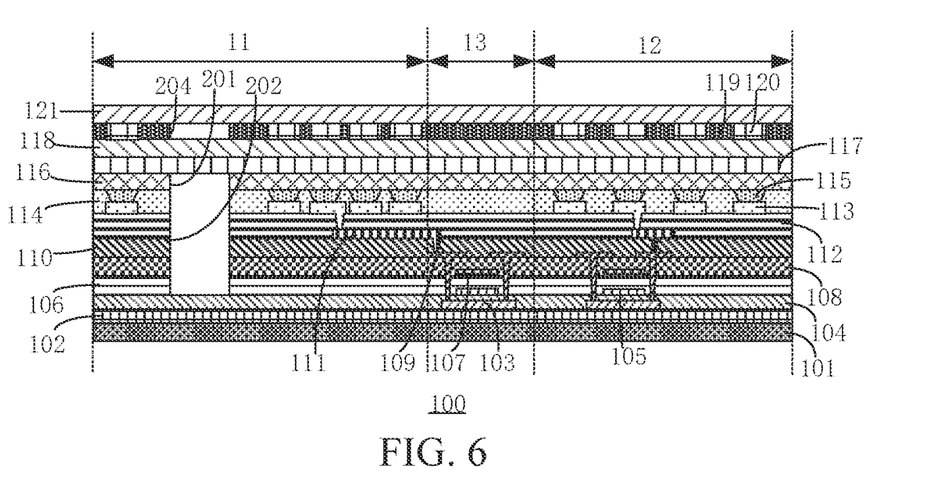
FIG. 6 is a second sectional schematic diagram illustrating the display panel according to the first embodiment of the present disclosure.
Figure 7:
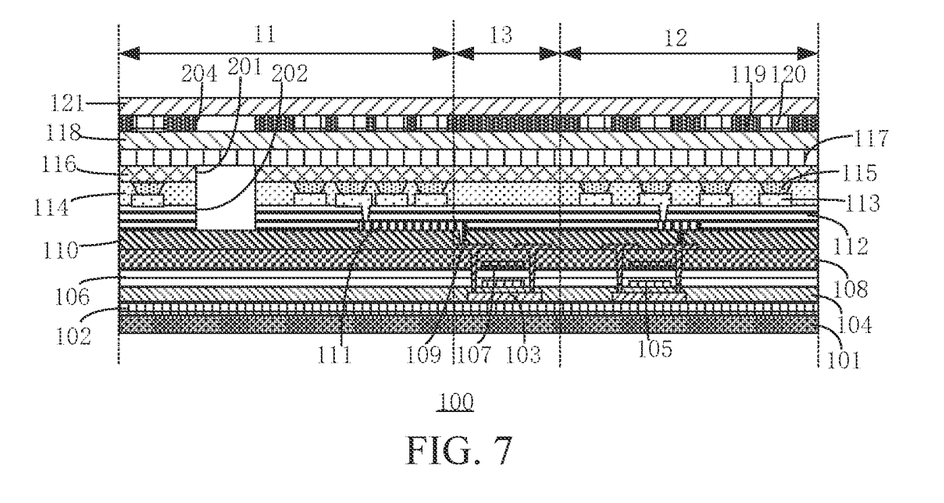
FIG. 7 is a third sectional schematic diagram illustrating the display panel according to the first embodiment of the present disclosure.

As an example, FIG. 3 is a first sectional schematic diagram illustrating the display panel according to the first embodiment of the present disclosure, FIG. 6 is a second sectional schematic diagram illustrating the display panel according to the first embodiment of the present disclosure, and FIG. 7 is a third sectional schematic diagram illustrating the display panel according to the first embodiment of the present disclosure. In FIGS. 3, 6 and 7, the layer structures extended through by the second light-transmitting holes 202 are different. In detail, as shown in the combination with FIGS. 3, 6 and 7, the second light-transmitting holes 202 can be through holes extending through the pixel defining layer 114, the planarization layer, and the thin film transistor layer, the second light-transmitting holes 202 can be through holes extending through the pixel defining layer 114, the planarization layer, the third inorganic insulating layer 108 and the second inorganic insulating layer 106 of the thin film transistor layer, or the second light-transmitting holes 202 can be through holes extending through the pixel defining layer 114 and the second planarization layer 112 of the planarization layer. In the embodiment, the second electrode layer 116 can cover at least part of the side walls of the second light-transmitting holes 202 (not shown) based on the limitations of the process. In practice, in order to pattern the second electrode layer 116 by laser technology, the second light-transmitting holes 202 are defined in the driving circuit layer first, then a metal sacrificial layer is disposed at a bottom portion of the second light-transmitting holes 202, then a light-emitting layer (such as an electron transporting layer and a hole transporting layer) and the second electrode layer 116 cover the driving circuit layer, then the metal sacrificial layer is heated by laser from the substrate 101, and then the expanding metal sacrificial layer after heated drives the light-emitting layer and the second electrode layer thereon 116 to fall off, thus the first light-transmitting holes 201 are defined in the second electrode layer 116., while a part of the second electrode layer 116 still covers at least a part of the sidewalls of the second light-transmitting holes 202. Therefore, the definition of the second light-transmitting holes 202 in the driving circuit layer can not only improve the light transmittance of the first display area 11, but also facilitate the realization of the laser patterning process to the second electrode layer 116.

As shown in FIG. 3, in the embodiment, the light-emitting layer 115, for example, only includes the. However, in other embodiments of the present disclosure, besides the light-emitting units disposed in the pixel defining openings, the light-emitting layer 115 further includes non-light-emitting parts disposed outside the pixel defining openings. For example, light-emitting materials consisting of main materials and doping materials can only disposed in the pixel defining openings, while other functional materials, such as an electron transporting layer and a hole transporting layer, cover the whole panel, are not just disposed in the pixel defining openings, and these parts of the materials cannot emit light independently. In this case, the light-emitting layer 115 includes a plurality of third light-transmitting holes arranged in the first display area 11. The first light-transmitting holes 201 communicate with the second light-transmitting holes 202 through the third light-transmitting holes, and the third light-transmitting holes are corresponding to the first light-transmitting hole 201 and the second transparent hole 202 respectively. In the embodiment of the present disclosure, the third light-transmitting holes are defined in the light-emitting layer 115, thus reducing the filter effect of the light-emitting layer 115 on ambient light passing through the gap area between the first light-emitting units 21 to reduce the light loss, effectively improving the light transmittance of the first display area 11, improving the light obtaining amount of the optical element 200, and improving the imaging effect of the camera.

In the embodiment, the display panel further includes a color filter layer disposed at a side of the second electrode layer 116 away from the substrate 101. In detail, the color filter layer includes a light shielding layer 119 and color resist 120, the light shielding layer 119 defines a plurality of first openings corresponding to the first light-emitting units 21, a plurality of second openings corresponding to the second light-emitting units 31, and the color resist 120 is filled in the first openings and the second openings. That is, the color resist 120 located in the first openings and the second openings corresponds to the first light-emitting units 21 and the second light-emitting units 31. In the embodiment of the present disclosure, the color filter layer is disposed at the side of the second electrode layer 116 away from the substrate 101, the color filter layer can realize the anti-reflection function, and at the same time the thickness is smaller than the polarizer in the normal technology, so as to avoid disposing the thick polarizer in the display panel 100 to reduce the overall thickness of the display panel 100.

In the embodiment, the light shielding layer 119 further defines a plurality of fourth light-transmitting holes 204 in the first display area 11, and the fourth light-transmitting holes 204 correspond to the first light-transmitting holes 201. In the embodiment of the present disclosure, the fourth light-transmitting holes 204 corresponding to the first light-transmitting holes 201 are defined in the light shielding layer 119, thus making ambient light pass through the light shielding layer 119 smoothly and transmit into the optical element 200, ensuring that the camera can normally achieve the imaging function.

In the embodiment, a distribution density of the first pixel repeating units 20 in the first display area 11 is equal to a distribution density of the second pixel repeating units 30 in a region with a same shape and area as the first display area 11 in the second display area 12. In other words, a quantity of the first pixel repeating units 20 in the first display area 11 is equal to a quantity of the second pixel repeating units 30 in a region with a same shape and area as the first display area 11 in the second display area 12. In practice, an arrangement of the first pixel repeating units 20 and an arrangement of the second pixel repeating units 30 are the same, and a distance between center points of the two adjacent first pixel repeating units 20 is equal to a distance between center points of the two adjacent second pixel repeating units 30.

Accordingly, a quantity of the first light-emitting units 21 included in one of the first pixel repeating units 20 is equal to a quantity of the second light-emitting units included in one of the second pixel repeating units. Therefore, a distribution density of the first light-emitting units 21 in the first display area 11 is equal to a distribution density of the second light-emitting units 31 in a region with a same shape and area as the first display area in the second display area 12. In other words, a quantity of the first light-emitting units 21 in the first display area 11 is equal to a quantity of the second light-emitting units 31 in a region with a same shape and area as the first display area 11 in the second display area 12, thus reducing the display difference between the first display area 11 and the second display area 12.

Accordingly, a distribution density of the first light-emitting units 21 is different from a distribution density of the second light-emitting units 31. In detail, in a unit size, a distribution density of the first light-emitting units 21 is greater than a distribution density of the second light-emitting units 31. The unit size is, for example, a size of the first pixel repeating unit 20. In other words, in the unit size corresponding to the first pixel repeating unit 20, an arrangement of the first light-emitting units is more compact, thus making a distance between adjacent two first pixel repeating units 20 greater than a distance between adjacent two second pixel repeating units 30, creating conditions for disposing a light-transmitting structure in the gap area between the adjacent first pixel repeating units 20.

Figure 8:
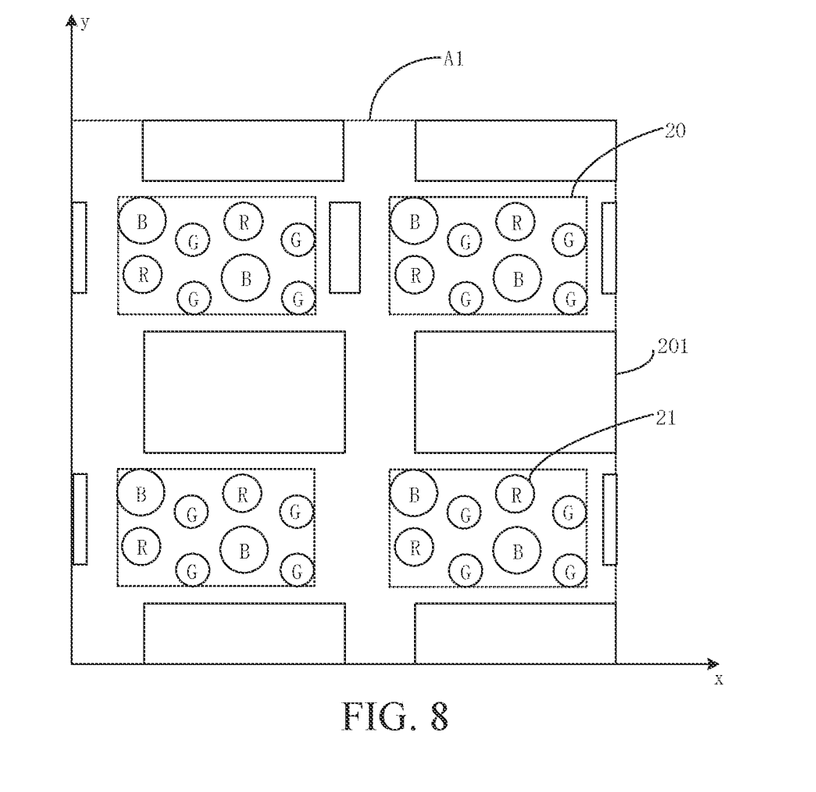
FIG. 8 is a second positional schematic diagram illustrating the first pixel repeating units and the first light-transmitting holes of the region A1 in FIG. 2.

In the embodiment, an arrangement of the first light-emitting units 21 in the first pixel repeating unit 20 is the same as an arrangement of the second light-emitting units 31 in the second pixel repeating unit 30 (That the arrangements are the same refers that the ways of the first light-emitting units 21 and the second light-emitting units 31 arranged in array are the same, and it is not limited that the spacing of the adjacent first light-emitting units 21 should be the same as the spacing of the adjacent second light-emitting units 31. For example, as shown in FIG. 4 and FIG. 5, blue light-emitting units B and red light-emitting units R are arranged in a row alternately, green light-emitting units G are arranged in another adjacent column, and the green light-emitting units G are located among the blue light-emitting units B and red light-emitting units R). In detail, FIG. 8 is a second positional schematic diagram illustrating the first pixel repeating units and the first light-transmitting holes of the region A1 in FIG. 2. Wherein, a quantity of the first light-emitting units 21 in each first pixel repeating unit 20 in FIG. 8 is the same as a quantity of the first light-emitting units 21 in each first pixel repeating unit 20 in FIG. 4, and an arrangement of the first light-emitting units 21 in each first pixel repeating unit 20 in FIG. 8 is the same as an arrangement of the first light-emitting units 21 in each first pixel repeating unit 20 in FIG. 4. Different from FIG. 4, an area of the first pixel repeating unit 20 in FIG. 8 is different from an area of the first pixel repeating unit 20 in FIG. 4, and an area of the first light-transmitting hole 201 in FIG. 8 is different from an area of the first light-transmitting hole 201 in FIG. 4.

As shown in the combination with FIG. 4, FIG. 5 and FIG. 8, a distance between adjacent two of the first light-emitting units 21 in the first pixel repeating unit 20 is less than a distance between corresponding adjacent two of the second light-emitting units 21 in the second pixel repeating unit 30.

Preferably, the first light-emitting units 21 in each first pixel repeating unit 20 include first sub-pixels displaying a first color, second sub-pixels displaying a second color, and third sub-pixels displaying a third color, and the second light-emitting units 31 in each second pixel repeating unit 20 include fourth sub-pixels displaying the first color, fifth sub-pixels displaying the second color, and sixth sub-pixels displaying the third color. Wherein, a distance between two adjacent first sub-pixels in each of the first pixel repeating units 20 is smaller than a distance between two adjacent fourth sub-pixels in each of the second pixel repeating units 30, a distance between two adjacent second sub-pixels in each of the first pixel repeating units 20 is smaller than a distance between two adjacent fifth sub-pixels in each of the second pixel repeating units and a distance between two adjacent third sub-pixels in each of the first pixel repeating units 20 is smaller than a distance between two adjacent sixth sub-pixels in each of the second pixel repeating units 30.

In the embodiment, the kind of the light-emitting units of different light-emitting colors included in each of the first pixel repeating units 20 is the same as the kind of the light-emitting units of different light-emitting colors included in each of the second pixel repeating units 30. Preferably, each of the first pixel repeating units 20 includes the first light-emitting units 21 of three different light-emitting colors, each of the second pixel repeating units 30 includes the second light-emitting units 31 of three different light-emitting colors, and the three different light-emitting colors are a first color, a second color, and a third color respectively.

Furthermore, a quantity of the first light-emitting units 21 of any one light-emitting color included in each of the first pixel repeating units 20 is equal to a quantity of the second light-emitting units 31 of a same light-emitting color included in each of the second pixel repeating units 30. In other words, a quantity of the first sub-pixels in each of the first pixel repeating units 20 is equal to a quantity of the fourth sub-pixels in each of the second pixel repeating units 30, a quantity of the second sub-pixels in each of the first pixel repeating units 20 is equal to a quantity of the fifth sub-pixels in each of the second pixel repeating units 30, and a quantity of the third sub-pixels in each of the first pixel repeating units 20 is equal to a quantity of the sixth sub-pixels in each of the second pixel repeating units 30.

In the embodiment, a size of the first light-emitting unit 21 is smaller than a size of the second light-emitting unit 31 in the first light-emitting units 21 and the second light-emitting units 31 with a same light-emitting color. In the embodiment of the present disclosure, the size of the first light-emitting unit 21 is reduced to improve the light transmittance of the first display area 11 of the display panel 100. Of course, the area of the first light-emitting unit 21 can also be designed to be greater than or equal to the area of the second light-emitting unit 31 according to actual requirements, enhancing the display effect of the first display area 11, and it is not limited here.

Figure 9:
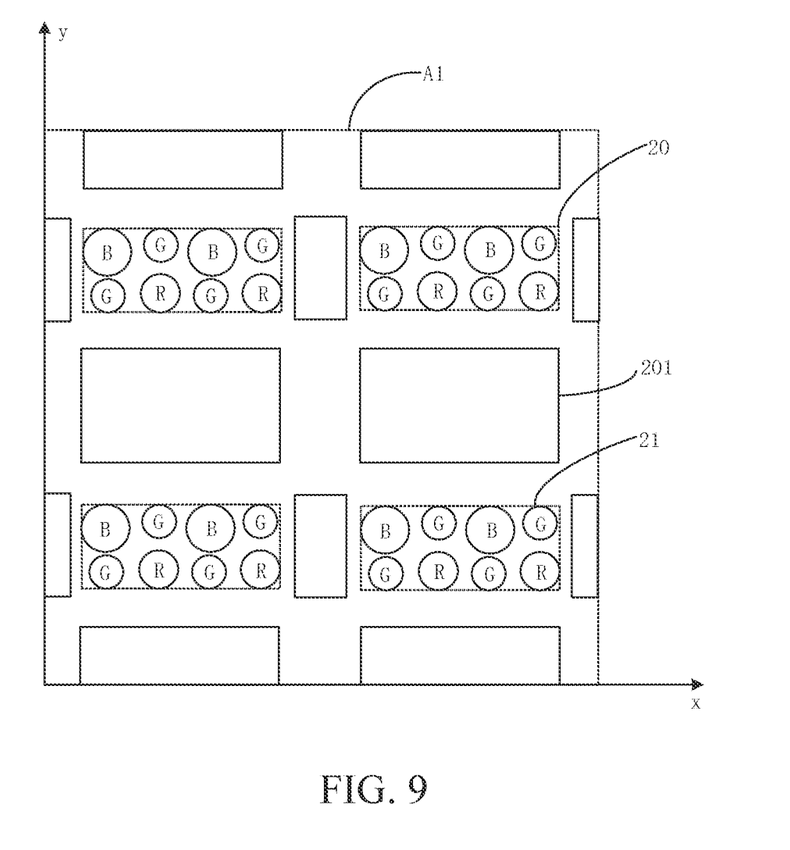
FIG. 9 is a third positional schematic diagram illustrating the first pixel repeating units and the first light-transmitting holes of the region A1 in FIG. 2.
Figure 10:
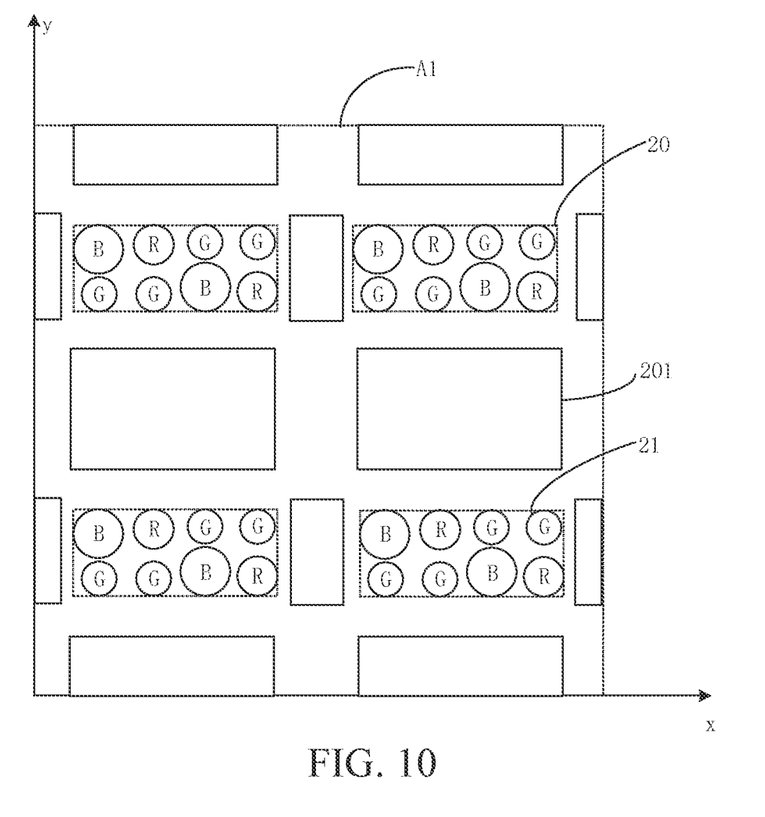
FIG. 10 is a fourth positional schematic diagram illustrating the first pixel repeating units and the first light-transmitting holes of the region A1 in FIG. 2.
Figure 11:
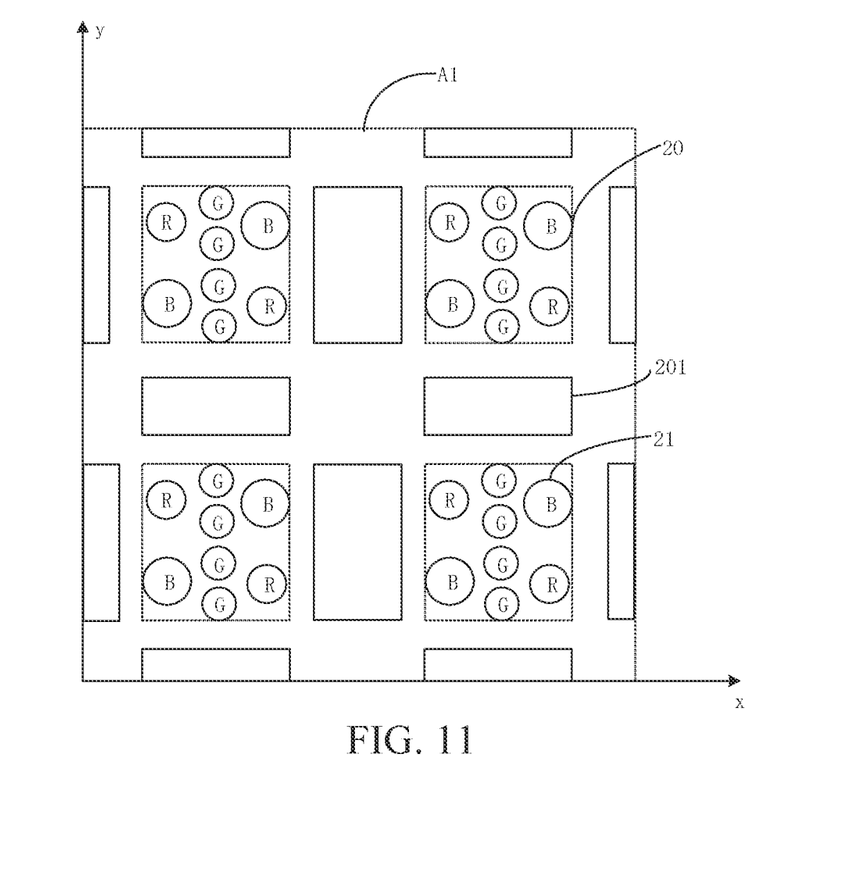
FIG. 11 is a fifth positional schematic diagram illustrating the first pixel repeating units and the first light-transmitting holes of the region A1 in FIG. 2.

In the embodiment of the present disclosure, of course, the arrangement of the first light-emitting units 21 in the second pixel repeating unit 30 is not limited. FIG. 9 is a third positional schematic diagram illustrating the first pixel repeating units and the first light-transmitting holes of the region A1 in FIG. 2, FIG. 10 is a fourth positional schematic diagram illustrating the first pixel repeating units and the first light-transmitting holes of the region A1 in FIG. 2, and FIG. 11 is a fifth positional schematic diagram illustrating the first pixel repeating units and the first light-transmitting holes of the region A1 in FIG. 2. As shown in FIGS. 9 to 11, in the display panel provided in the embodiment of the present disclosure, an arrangement of the first light-emitting units 21 in the first pixel repeating unit 20 can also be different from an arrangement of the second light-emitting units 31 in the second pixel repeating unit 30. The first light-emitting units 21 in the first pixel repeating unit 20 and the second light-emitting units 31 in the second pixel repeating unit 30 are not limited to be with same arrangements and can be arbitrarily arranged. Therefore, the gap distance between the first light-emitting units 21 in the first pixel repeating unit 20 can be further reduced, the area of the first pixel repeating unit 20 can be further reduced, and the light transmittance of the first display area 11 is further improved.

The relative positional relationship between the first display area 11 and the second display area 12 is described in detail below. In the embodiment of the present disclosure, the first display area 11 and the second display area 12 are spaced apart, the display panel 100 further includes a transition display area 13 disposed between the first display area 11 and the second display area 12, and a plurality of pixel driving circuits electrically connected to the first light-emitting units 21 are disposed in the transition display area 13. As there is no requirement for the light transmitting function in the transition display area 13, the pixel driving circuits electrically connected to and driving the first light-emitting units 21 are disposed in the transition display area 13 in the embodiment of the present disclosure, thus further improving the light transmittance of the first display area 11.

In the embodiment, the pixel driving circuits in the transition display area 13 are electrically connected to the first light-emitting units 21 by transparent metal wirings 111.

Furthermore, in each of the first pixel repeating units 20, a plurality of the first light-emitting units 21 with a same light-emitting color are electrically connected to a same pixel driving circuit. In the case, a quantity of the pixel driving circuits configured to drive the first light-emitting units 21 in each of the first pixel repeating units 20 can be less than a quantity of the first light-emitting units 21 in each of the first pixel repeating units 20, thereby significantly reducing the layout difficulty of the pixel driving circuits in the transition display area 13, reducing the manufacturing cost. Of course, in other embodiments of the present disclosure, each of the first light-emitting units 21 is electrically connected to a corresponding one of the pixel driving circuits. That is, each pixel driving circuit is connected to one light-emitting unit 21.

In the embodiment of the present disclosure, the first light-emitting units 21 in each of the first pixel repeating units 20 include two first sub-pixels displaying a first color, two second sub-pixels displaying a second color, and four third sub-pixels displaying a third color, wherein a size of the first sub-pixel and a size of the second sub-pixel both are greater than a size of the third sub-pixel.

Preferably, the first sub-pixels display a blue color, the second sub-pixels display a red color, and third sub-pixels display a green color. In other words, each of the first pixel repeating unit 20 includes the eight first light-emitting units 21, and the eight first light-emitting units 21 are two blue light-emitting units B, two red light-emitting units R, and four green light-emitting units G respectively. Of course, in the embodiment of the present disclosure, a quantity of the first light-emitting units 21 included in the first pixel repeating unit 20 is not limited. In other embodiments of the present disclosure, the first pixel repeating unit 20 also can include the first light-emitting units 21 of another quantity such as four, and the four first light-emitting units 21 are one blue light-emitting units B, one red light-emitting units R, and two green light-emitting units G respectively.

In the embodiment, the display panel 100, for example, further includes an encapsulation layer 117 configured to protect the light-emitting layer 115 and prevent external moisture from invading the interior of the display panel 100. In detail, the encapsulation layer 117 is disposed between the second electrode layer 116 and the color filter layer and is connected to the second electrode layer 116. The encapsulation layer 117 can include a composite layer including inorganic encapsulation layers and organic encapsulation layers.

In the embodiment, the display panel 100, for example, further includes a touch layer 118 configured to perform the touch function. The touch type thereof can be a self-capacity type or a mutual capacity type, and materials of the touch layer 118 can be transparent conductive materials or mesh metal. In detail, the touch layer 118 is arranged between the encapsulation layer 117 and the color filter layer and is connected to the encapsulation layer 117.

In the embodiment, the display device further includes a cover plate 121 located at a side of the display panel 100, and the cover plate 121 is connected to the color filter layer of the display panel 100. The display device further includes a backplane and a heat dissipation layer (not shown) located at the other side of the display panel 100, the backplane is located between the substrate 101 and the heat dissipation layer, and the backplane is connected to the substrate 101.

Second Embodiment

Figure 12:
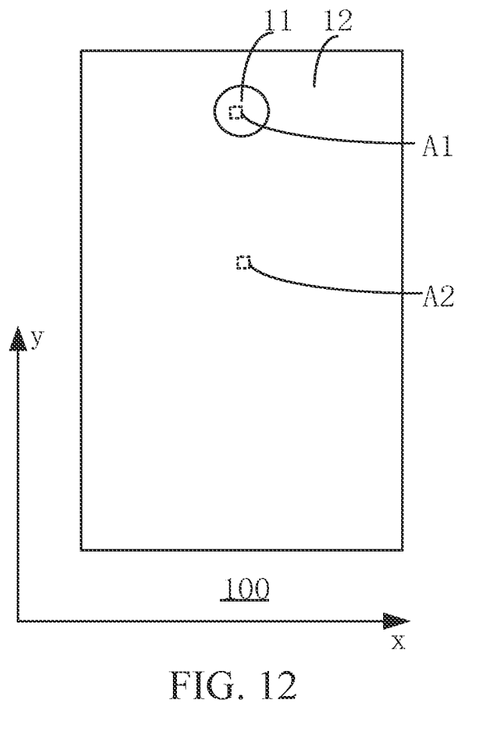
FIG. 12 is a top-down schematic diagram illustrating a display panel according to a second embodiment of the present disclosure.
Figure 13:
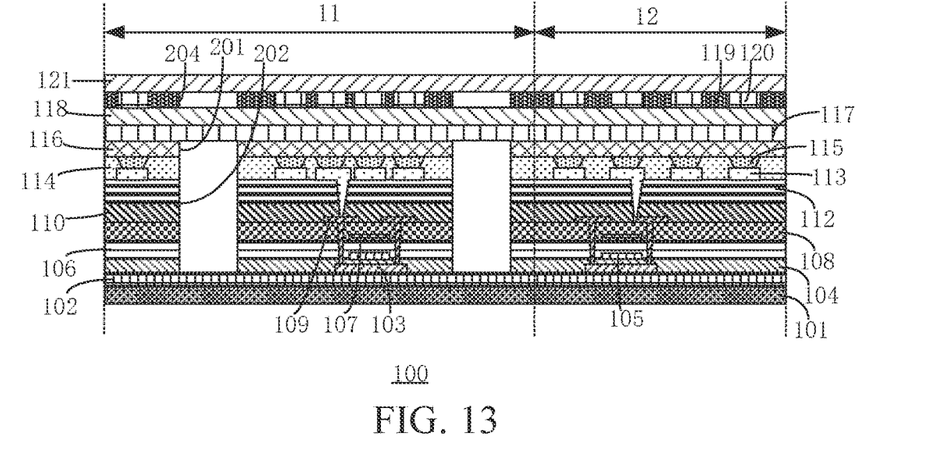
FIG. 13 is a first positional schematic diagram illustrating first pixel repeating units and first light-transmitting holes of the region A1 in FIG. 12.
Figure 14:
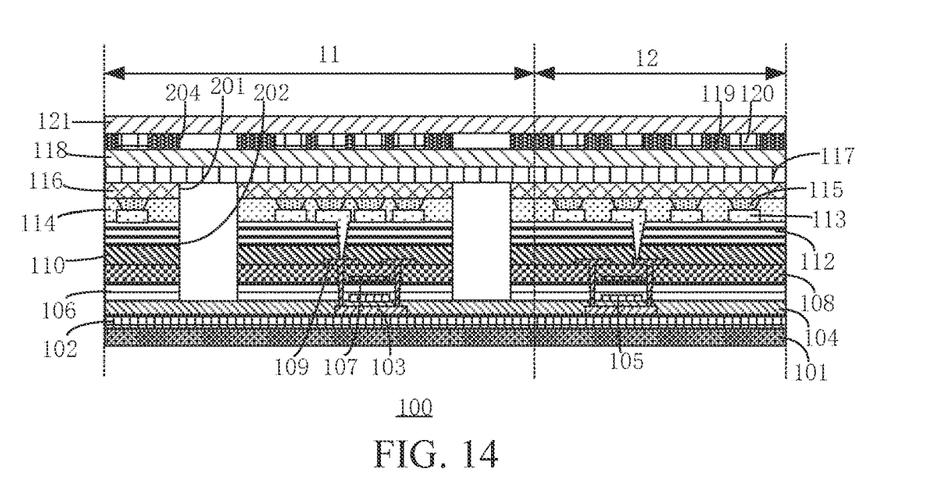
FIG. 14 is a second positional schematic diagram illustrating the first pixel repeating units and the first light-transmitting holes of the region A1 in FIG. 12.
Figure 15:
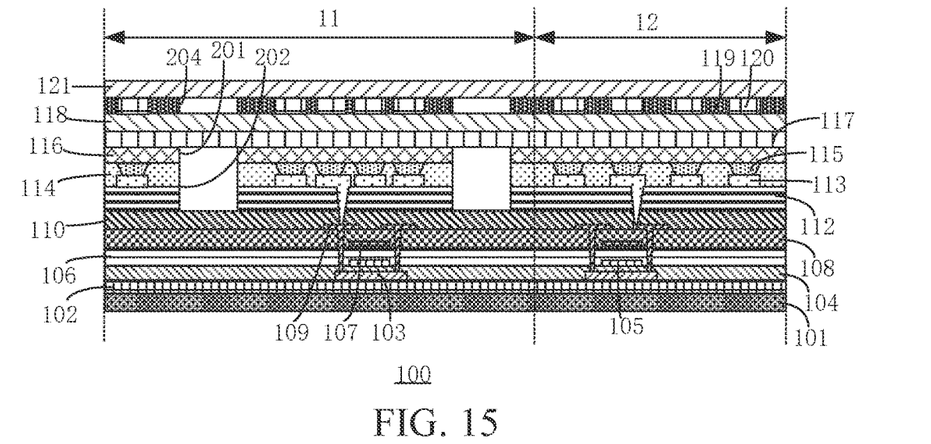
FIG. 15 is a third positional schematic diagram illustrating the first pixel repeating units and the first light-transmitting holes of the region A1 in FIG. 12.

FIG. 12 is a top-down schematic diagram illustrating a display panel according to a second embodiment of the present disclosure, FIG. 13 is a first positional schematic diagram illustrating first pixel repeating units and first light-transmitting holes of the region A1 in FIG. 12, FIG. 14 is a second positional schematic diagram illustrating the first pixel repeating units and the first light-transmitting holes of the region A1 in FIG. 12, and FIG. 15 is a third positional schematic diagram illustrating the first pixel repeating units and the first light-transmitting holes of the region A1 in FIG. 12. As shown in the combination with FIGS. 1 and 12 to 15, the second embodiment of the present disclosure is provided with a display device 10 including an optical element 200 and a display panel 100, wherein the optical element 200 is located at a side of the display panel 100 and is disposed corresponding to the first display area 11 of the display panel 100. The structure of the display panel 100 is similar to that of the display panel 100 in the first embodiment of the present disclosure, and the same parts will not be described in the second embodiment of the present disclosure.

The difference is that the position of the pixel driving circuits electrically connected with the first light-emitting units 21 is different from that of the first embodiment. In detail, the first display area 11 is provided with the pixel driving circuits electrically connected with the first light-emitting units 21, and the pixel driving circuits overlap with the first pixel repeating units 20. In the display panel 100 in the second embodiment of the present disclosure, the pixel driving circuits overlap with the first pixel repeating units 20 electrically connected with the first light-emitting units 21. On the premise that the above design meets the light transmittance requirement of the first display area 11, the pixel driving circuits electrically connected with the first light-emitting units 21 are disposed under the first light-emitting units 21, and there is no need to dispose additional transparent metal wirings 111, reducing the design difficulty of wirings in the first display area 11, thereby having the effects of simplifying the layer structure and reducing the number of the manufacturing processes.

In conclusion, the embodiments of the present disclosure are provided with a display panel and a display device. The display panel includes a first display area and a second display area surrounding the first display area. The first display area is provided with a plurality of first pixel repeating units, and each of the first pixel repeating units includes a plurality of first light-emitting units. The second display area is provided with a plurality of second pixel repeating units, and each of the second pixel repeating units includes a plurality of second light-emitting units. Wherein a quantity of the first light-emitting units included in one of the first pixel repeating units is equal to a quantity of the second light-emitting units included in one of the second pixel repeating units, and an area of one of the first pixel repeating units is smaller than an area of one of the second pixel repeating units. In the embodiments of the present disclosure, the first light-emitting units of a fixed quantity in the first display area are grouped as a first pixel repeating unit, the second light-emitting units of a corresponding quantity in the second display area are grouped as a second pixel repeating unit, and an area of the first pixel repeating unit is smaller than an area of the second pixel repeating unit, thus realizing a gap area between adjacent first pixel repeating units of a larger area than that of a gap area between adjacent second pixel repeating units, so as to facilitate the design of the structure of layers in the gap area between adjacent first pixel repeating units and to provide a light transmitting structure to improve the light transmittance of the first display area.

A lens layer and a display device provided in the embodiments of the present disclosure are described in detail above. The principle and implementations of the present disclosure are described in this specification by using specific examples. The description about the foregoing embodiments is merely provided to help understand the method and core ideas of the present disclosure. In addition, persons of ordinary skill in the art can make modifications in terms of the specific implementations and application scopes according to the ideas of the present disclosure. Therefore, the content of this specification shall not be construed as a limit to the present disclosure.

What is claimed is:

1. A display panel comprising a first display area and a second display area surrounding the first display area, wherein the display panel further comprises:
   a substrate, and
   a light-emitting layer disposed at a side of the substrate, wherein the light-emitting layer comprises a plurality of first pixel repeating units disposed in the first display area and a plurality of second pixel repeating units disposed in the second display area, each of the first pixel repeating units comprises a plurality of first light-emitting units, and each of the second pixel repeating units comprises a plurality of second light-emitting units,
   wherein a quantity of the first light-emitting units comprised in one of the first pixel repeating units is equal to a quantity of the second light-emitting units comprised in one of the second pixel repeating units, and an area of one of the first pixel repeating units is smaller than an area of one of the second pixel repeating units;

a first electrode layer disposed between the substrate and the light-emitting layer, and a second electrode layer disposed at a side of the light-emitting layer away from the substrate, wherein the second electrode layer comprises a plurality of first light-transmitting holes defined in the first display area, and the first light-transmitting holes are located between the adjacent first pixel repeating units; a driving circuit layer disposed between the substrate and the light-emitting layer, wherein the driving circuit layer comprises a plurality of second light-transmitting holes defined in the first display area, and the second light-transmitting holes correspond to the first light-transmitting holes; wherein the second electrode layer covers at least a part of side walls of the second light-transmitting holes; wherein the light-emitting layer comprises a plurality of third light-transmitting holes defined in the first display area, and each of the first light-transmitting holes communicates with corresponding one of the second light-transmitting holes by corresponding one of the third light-transmitting holes.

2. The display panel as claimed in claim 1, wherein the display panel further comprises a color filter layer disposed at a side of the second electrode layer away from the substrate, wherein the color filter layer comprises a light shielding layer and color resist, the light shielding layer defines a plurality of first openings corresponding to the first light-emitting units, a plurality of second openings corresponding to the second light-emitting units, and a plurality of fourth light-transmitting holes in the first display area, the color resist is filled in the first openings and the second openings, and the fourth light-transmitting holes correspond to the first light-transmitting holes.

3. The display panel as claimed in claim 1, wherein a distribution density of the first pixel repeating units in the first display area is equal to a distribution density of the second pixel repeating units in a region with a same shape and area as the first display area in the second display area.

4. The display panel as claimed in claim 3, wherein a distribution density of the first light-emitting units in the first display area is equal to a distribution density of the second light-emitting units in a region with a same shape and area as the first display area in the second display area.

5. The display panel as claimed in claim 4, wherein a distribution density of the first light-emitting units is different from a distribution density of the second light-emitting units in a unit size.

6. The display panel as claimed in claim 1, wherein an arrangement of the first light-emitting units in the first pixel repeating unit is to the same as an arrangement of the second light-emitting units in the second pixel repeating unit.

7. The display panel as claimed in claim 6, wherein a distance between adjacent two of the first light-emitting units in the first pixel repeating unit is less than a distance between corresponding adjacent two of the second light-emitting units in the second pixel repeating unit.

8. The display panel as claimed in claim 6, wherein the first light-emitting units in each first pixel repeating unit comprise first sub-pixels displaying a first color, second sub-pixels displaying a second color, and third sub-pixels displaying a third color, and the second light-emitting units in each second pixel repeating unit comprise fourth sub-pixels displaying the first color, fifth sub-pixels displaying the second color, and sixth sub-pixels displaying the third color, and wherein a distance between two adjacent first sub-pixels in each of the first pixel repeating units is smaller than a distance between two adjacent fourth sub-pixels in each of the second pixel repeating units, a distance between two adjacent second sub-pixels in each of the first pixel repeating units is smaller than a distance between two adjacent fifth sub-pixels in each of the second pixel repeating units, and a distance between two adjacent third sub-pixels in each of the first pixel repeating units is smaller than a distance between two adjacent sixth sub-pixels in each of the second pixel repeating units.

9. The display panel as claimed in claim 6, wherein a size of the first light-emitting unit is smaller than a size of the second light-emitting unit in the first light-emitting units and the second light-emitting units with a same light-emitting color.

10. The display panel as claimed in claim 1, wherein the display panel further comprises a transition display area disposed between the first display area and the second display area, and a plurality of pixel driving circuits electrically connected to the first light-emitting units are disposed in the transition display area.

11. The display panel as claimed in claim 10, wherein in each of the first pixel repeating units, a plurality of the first light-emitting units with a same light-emitting color are electrically connected to a same pixel driving circuit.

12. The display panel as claimed in claim 1, wherein a plurality of pixel driving circuits electrically connected with the first light-emitting units are disposed in the first display area, and the pixel driving circuits are overlapped with the first pixel repeating units.

13. The display panel as claimed in claim 12, wherein in each of the first pixel repeating units, a plurality of the first light-emitting units with a same light-emitting color are electrically connected to a same pixel driving circuit.

14. The display panel as claimed in claim 13, wherein the first light-emitting units in each of the first pixel repeating units comprise two first sub-pixels displaying a first color, two second sub-pixels displaying a second color, and four third sub-pixels displaying a third color, wherein a size of the first sub-pixel and a size of the second sub-pixel both are greater than a size of the third sub-pixel.

15. The display panel as claimed in claim 12, wherein each of the first light-emitting units is electrically connected to a corresponding one of the pixel driving circuits.

16. A display device comprising:
an optical element, and
the display panel of claim 1,
wherein the optical element is located at a side of the display panel and corresponds to the first display area of the display panel.

* * * * *